US012701308B2

(12) United States Patent
Blake, III et al.

(10) Patent No.: US 12,701,308 B2
(45) Date of Patent: Aug. 4, 2026

(54) TAMPER DISABLEMENT SYSTEM

(71) Applicant: ZF Friedrichshafen AG,
Friedrichshafen (DE)

(72) Inventors: Thomas E. Blake, III, Novi, MI (US);
Grzegorz Ciosk, Tychy (PL); **Gregory
Ratcliffe**, Taylor, MI (US)

(73) Assignee: ZF Friedrichshafen AG,
Friedrichshafen (DE)

( * ) Notice: Subject to any disclaimer, the term of this
patent is extended or adjusted under 35
U.S.C. 154(b) by 286 days.

(21) Appl. No.: 18/490,818

(22) Filed: Oct. 20, 2023

(65) Prior Publication Data

US 2025/0133282 A1     Apr. 24, 2025

(51) Int. Cl.
H04N 23/52 (2023.01)
H05K 5/02 (2006.01)

(52) U.S. Cl.
CPC ........... H04N 23/52 (2023.01); H05K 5/0208
(2013.01); H05K 5/0247 (2013.01)

(58) Field of Classification Search
None
See application file for complete search history.

(56) References Cited

U.S. PATENT DOCUMENTS

| | | | |
|---|---|---|---|
| 9,578,763 B1 * | 2/2017 | Wade ................... | H05K 5/0086 |
| 9,730,315 B1 * | 8/2017 | Razaghi ............... | H05K 1/0275 |
| 2011/0031985 A1 * | 2/2011 | Johnson ............... | H05K 1/0275 |
| | | | 324/681 |
| 2024/0096205 A1 * | 3/2024 | Qin ...................... | G08B 29/046 |

* cited by examiner

*Primary Examiner* — Anh Q Tran
(74) *Attorney, Agent, or Firm* — Kristin L. Murphy

(57) ABSTRACT

A tamper disablement system is disclosed. The tamper
disablement system can include a conductive layer having a
first terminal and a second terminal. The tamper disablement
system can also include an enclosure contact in electrical
connection with the first terminal and the second terminal to
form a closed-loop circuit and a controller. The controller is
configured transmit an electrical signal via the conductive
layer and detect the electrical signal within the closed-loop
circuit, wherein the controller is configured to transmit a
terminate signal when the controller detects a change in
electrical properties of the electrical signal.

19 Claims, 2 Drawing Sheets

TAMPER DISABLEMENT SYSTEM

TECHNICAL FIELD

The present disclosure relates to securing an electronic device, and more specifically relates a tamper disablement system for an image sensor assembly.

BACKGROUND

In many instances, entities have an interest in preventing competitors from determining a design and/or a configuration of an electronic device, such as an image sensor. When reverse engineering an electronic device, the competitor typically legally obtains the electronic device and performs disassembly and inspection to reveal internal components, connections, and/or the general architecture of the electronic device.

Additionally, vehicles, such as autonomous vehicles, that incorporate image sensors may be targeted for sabotage or malicious intent as the number of vehicles that utilize image sensors increase. As such, ensuring the security of these vehicles is paramount to mitigate potential sabotage and/or malicious intent.

SUMMARY

A tamper disablement system is disclosed. The tamper disablement system can include a conductive layer having a first terminal and a second terminal. The tamper disablement system can also include an enclosure contact in electrical connection with the first terminal and the second terminal to form a closed-loop circuit and a controller. The controller is configured to transmit an electrical signal via the conductive layer and detect the electrical signal within the closed-loop circuit, wherein the controller is configured to transmit a terminate signal when the controller detects a change in electrical properties of the electrical signal.

In another exemplary arrangement, the tamper disablement system includes a switch that is configured to transition between an open state and closed state, wherein the terminate signal causes the switch to transition from the open state to the closed state.

In another exemplary arrangement, the tamper disablement system includes a fuse, wherein the controller is further configured to provide an electrical current to the fuse when the switch is transitioned to the closed state, wherein the fuse disables functionality of an image sensor when the fuse receives the electrical current.

In another exemplary arrangement, the tamper disablement system includes a printed circuit board assembly, the printed circuit board assembly including the fuse.

In another exemplary arrangement, the printed circuit board assembly comprises a multilayer substrate.

In another exemplary arrangement, the multilayer substrate comprises at least one dielectric layer and at least one conductive layer.

In another exemplary arrangement, the at least one dielectric layer includes the fuse.

In another exemplary arrangement, the tamper disablement system includes an electronic control unit operably connected to the controller, wherein the electronic control unit disables functionality of an image sensor in response to receiving the terminate signal.

In another exemplary arrangement, the tamper disablement system includes a lens assembly, the lens assembly including a base portion and a lens barrel portion, wherein the base portion includes the enclosure contact.

A tamper disablement system is disclosed. The tamper disablement system can include a conductive layer having a first terminal and a second terminal. The tamper disablement system can also include an enclosure contact in electrical connection with the first terminal and the second terminal to form a closed-loop circuit and a lens assembly that includes the enclosure contact. The tamper disablement system can also include a controller configured to transmit an electrical signal via the conductive layer and detect the electrical signal within the closed-loop circuit, wherein the controller is configured to transmit a terminate signal when the controller detects a change in electrical properties of the electrical signal.

In another exemplary arrangement, the tamper disablement system includes a switch that is configured to transition between an open state and closed state, wherein the terminate signal causes the switch to transition from the open state to the closed state.

In another exemplary arrangement, the tamper disablement system includes a fuse, wherein the controller is further configured to provide an electrical current to the fuse when the switch is transitioned to the closed state, wherein the fuse disables functionality of an image sensor when the fuse receives the electrical current.

In another exemplary arrangement, the tamper disablement system includes a printed circuit board assembly, the printed circuit board assembly including the fuse.

In another exemplary arrangement, the printed circuit board assembly comprises a multilayer substrate.

In another exemplary arrangement, the multilayer substrate comprises at least one dielectric layer and at least one conductive layer.

In another exemplary arrangement, the at least one dielectric layer includes the fuse.

In another exemplary arrangement, the tamper disablement system includes an electronic control unit operably connected to the controller, wherein the electronic control unit disables functionality of an image sensor in response to receiving the terminate signal.

A tamper disablement system is disclosed. The tamper disablement system can include a conductive layer having a first terminal and a second terminal. The tamper disablement system can also include an enclosure contact in electrical connection with the first terminal and the second terminal to form a closed-loop circuit and a lens assembly that includes the enclosure contact. The tamper disablement system can also include a controller configured to transmit an electrical signal via the conductive layer and detect the electrical signal within the closed-loop circuit, wherein the controller is configured to provide an electrical current to a fuse that disables functionality of an image sensor.

In another exemplary arrangement, the tamper disablement system includes a printed circuit board assembly that includes the fuse, the printed circuit board assembly comprising a multilayer substrate.

In another exemplary arrangement, the fuse is disposed within at least one layer of the multilayer substrate.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

The present disclosure is related to a tamper disablement system for an electronic device, such as an image sensor assembly. As discussed herein, the tamper disablement system can increase the difficulty related to reverse engineering the electronic device. In an exemplary arrangement, the tamper disablement system can disable an image sensor when electrical properties of an enclosure contact are altered. For example, the electrical properties of the enclosure contact may be altered as a result of disassembly of the image sensor assembly. As such, the tamer disablement system described herein can disable an image sensor assembly within a vehicle, such as an autonomous vehicle, after a tampering event.

Figure 1:
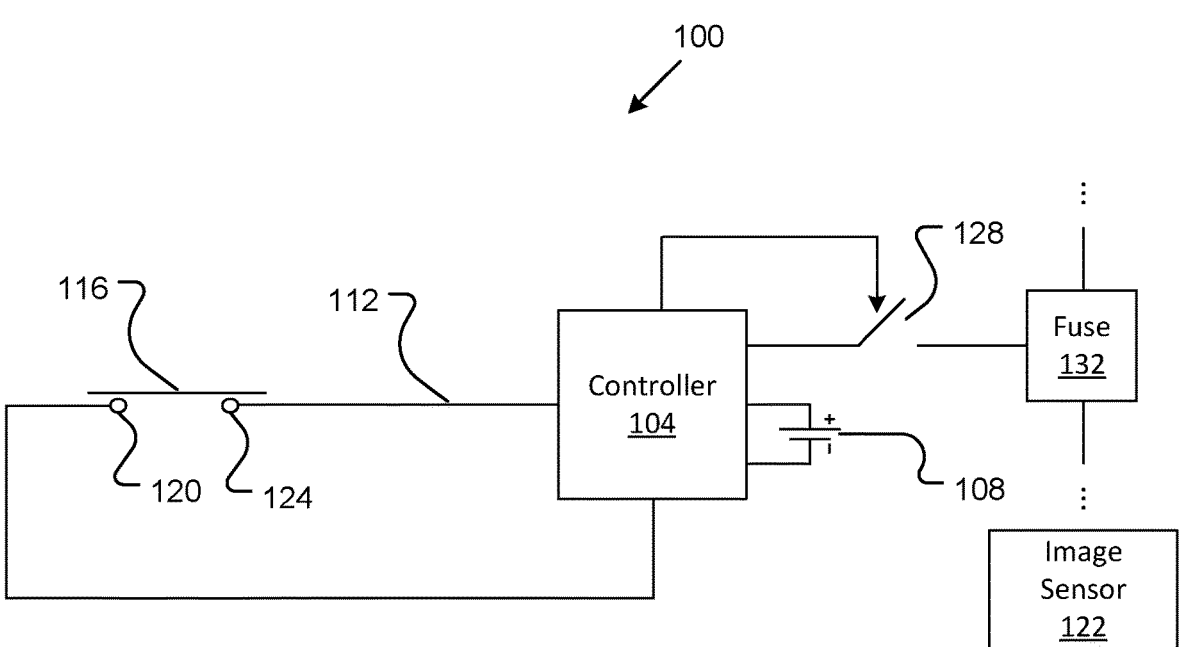
FIG. 1 is a circuit schematic illustration of a tamper disablement system according to an exemplary arrangement of the present disclosure.
Figure 2:
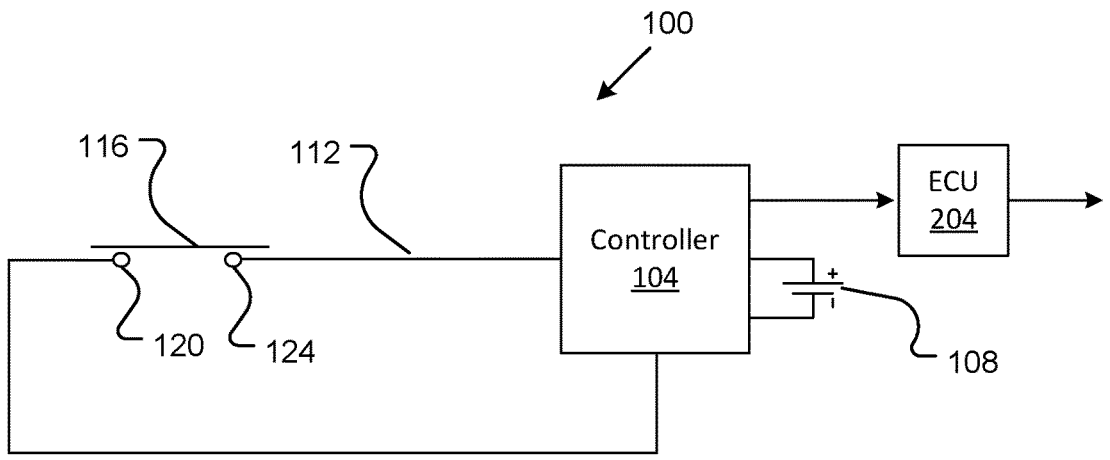
FIG. 2 is a circuit schematic illustration of a tamper disablement system according to another exemplary arrangement of the present disclosure.

FIGS. 1 and 2 illustrate a tamper disablement system 100 for an image sensor assembly 300 (see FIG. 3) according to various exemplary arrangements. As shown, the tamper disablement system 100 includes a controller 104, a power source 108, a conductive layer 112, and an enclosure contact 116.

As shown in FIG. 1, the conductive layer 112 and the enclosure contact 116 comprises a metallic material having sufficient conductivity. Examples of such metallic materials include gold, aluminum, aluminum alloys, and indium tin oxide.

The power source 108 can supply power to the controller 104. In various exemplary arrangements, the power source 108 includes a rechargeable lithium-ion battery.

The controller 104 can comprise a microcontroller that, when operational, continually transmits electrical signals at predetermined time internals. The conductive layer 112 form a closed loop to allow the controller 104 to transmit the electrical signals and determine whether the controller 104 detects the transmitted electrical signal. For example, when the conductive layer 112 and the enclosure contact 116 are electrically connected, the conduct layer 112 and the enclosure contact 116 form a closed-circuit loop to allow for the flow of electrical current representing the transmitted electrical signal.

As shown in FIGS. 1 and 2, the conductive enclosure contact 116 is disposed between terminals 120, 124 to form the closed-circuit loop. In the event of tampering with a lens assembly 304 (see FIG. 3) of the image sensor assembly 300, the enclosure contact 116 is altered such that an electrical property of the tamper disablement system 100 is altered, such as the electrical continuity of the enclosure contact 116. For example, an individual may attempt to access an image sensor 122 for reverse engineering purposes. The image sensor 122 may be disposed within a lens assembly 304 of the image sensor 300.

When the lens assembly 304 is accessed, the electrical properties of the enclosure contact 116 are altered. In these instances, the controller 104 can detect a change in electrical properties of the transmitted electrical current. For example, altering of the electrical properties of the enclosure contact may result in the closed-circuit loop transitioning to an open circuit that prevents the flow of electrical current.

Referring to the exemplary arrangement illustrated in FIG. 1, when the controller 104 detects a change in the electrical current, the controller 104 transmits a terminate signal to cause a switch 128 to transition from an open state to a closed state. When the switch 128 is transitioned to the closed state, an electrical current is provided to a fuse 132 that disables functionality of the image sensor 122. For instance, the fuse 132 transition from a closed circuit to an open circuit due to an increase in electrical current being supplied to the fuse 132.

Referring to the exemplary arrangement illustrated in FIG. 2, when the controller 104 detects a change in the electrical current, the controller 104 transmits a terminate signal to an electronic control unit (ECU) 204. The ECU 204 can be configured to also disable functionality of the image sensor 122 based on receiving of the terminate signal.

Figure 3:
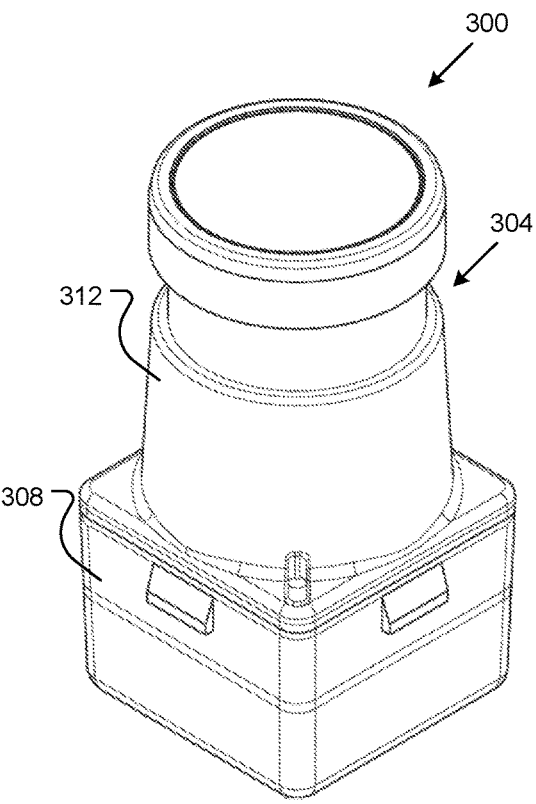
FIG. 3 is a diagrammatic partial elevated view of an image sensor assembly according to an exemplary arrangement of the present disclosure.

FIG. 3 illustrates the image sensor 300 according to an exemplary arrangement. The image sensor 300 includes the lens assembly 304 that houses the image sensor 122 therein. In an exemplary arrangement, the image sensor 122 is mounted to a printed circuit board assembly (PCBA) (not shown in FIG. 3).

The lens assembly 304 can include a base portion 308 and a lens barrel portion 312. The PCBA may be mounted to the base portion 308. In this exemplary arrangement, the base portion 308 can include the enclosure contact 116. For example, the base portion 308 may comprise one or more metallic materials as described above. As such, detaching one or more portions of the base portion from the PCBA can result in the altering of electrical properties of the enclosure contact 116. Similarly, the enclosure contact 116 may comprise an electrical trace on or within the base portion 308.

Figure 4:
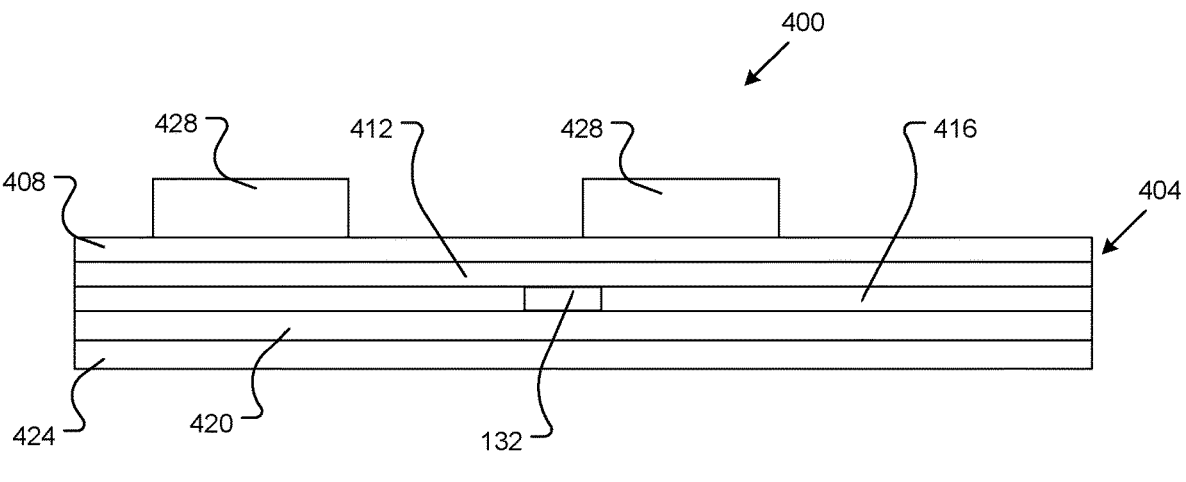
FIG. 4 is a diagrammatic cross-sectional view of a printed circuit board assembly according to an exemplary arrangement of the present disclosure.

FIG. 4 illustrates an example PCBA 400 according to an exemplary arrangement. As shown, the PCBA 400 comprises a substrate 404 including multiple layers 408, 412, 416, 420, 424. In the exemplary arrangement shown, the layers 408, 416, 424 can comprise dielectric layers, and the layers 412, 420 can comprise conductive layers. It is understood that the substrate 404 can include additional or fewer layers depending on the design and/or requirements of the PCBA 400.

The dielectric layers 408, 416, 424 can comprise insulating material that serves to electrically isolate adjacent conductive layers 412, 420 while also providing structural integrity to the PCBA 400.

The conductive layers 412, 420 can comprise a network of conductive traces that facilitate interconnection of various electronic components 428 of the PCBA 400. For example, the electronic components 428 can include, but are not necessarily limited to, resistors, capacitors, fuses, integrated circuits, and other active or passive electronic elements.

As shown in FIG. 4, the fuse 132 can be positioned, i.e., "buried," within the substrate 404 during the PCBA 400 manufacturing process. In an exemplary arrangement, as discussed above, the fuse 132 can be positioned in one of the dielectric layers 408, 416, 424. In another exemplary arrangement, the fuse 132 can be incorporated within one of the conductive layers 412, 420. For example, the fuse 132 may fully reside on a conductive layer 412, 420 as a trace.

Positioning the fuse 132 within the substrate 404 can increase the difficulty of repairing the fuse 132 after a tampering event. For example, the location of the fuse 132 within the substrate 404 may not be known to an individual attempting to repair the image sensor 300 after the tampering event.

Accordingly, it is to be understood that the above description is intended to be illustrative and not restrictive. Many implementations and applications other than the examples provided would be apparent to those of skill in the art upon reading the above description. The scope of the disclosure should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future implementations. In sum, it should be understood that the invention is capable of modification and variation and is limited only by the following claims.

All terms used in the claims are intended to be given their plain and ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A tamper disablement system, comprising:
a conductive layer having a first terminal and a second terminal;
an enclosure contact in electrical connection with the first terminal and the second terminal to form a closed-loop circuit;
a lens assembly, the lens assembly including a base portion and a lens barrel portion, wherein the base portion includes the enclosure contact; and
a controller that is configured to transmit an electrical signal via the conductive layer and detect the electrical signal within the closed-loop circuit, wherein the controller is configured to transmit a terminate signal when the controller detects a change in electrical properties of the electrical signal.

2. The tamper disablement system as recited in claim 1, further comprising a switch that is configured to transition between an open state and closed state, wherein the terminate signal causes the switch to transition from the open state to the closed state.

3. The tamper disablement system as recited in claim 2, further comprising a fuse, wherein the controller is further configured to provide an electrical current to the fuse when the switch is transitioned to the closed state, wherein the fuse disables functionality of an image sensor when the fuse receives the electrical current.

4. The tamper disablement system as recited in claim 3, further comprising a printed circuit board assembly, the printed circuit board assembly including the fuse.

5. The tamper disablement system as recited in claim 4, wherein the printed circuit board assembly comprises a multilayer substrate.

6. The tamper disablement system as recited in claim 5, wherein the multilayer substrate comprises at least one dielectric layer and at least one conductive layer.

7. The tamper disablement system as recited in claim 6, wherein the at least one dielectric layer includes the fuse.

8. The tamper disablement system as recited in claim 1, further comprising an electronic control unit operably connected to the controller, wherein the electronic control unit disables functionality of an image sensor in response to receiving the terminate signal.

9. A tamper disablement system, comprising:
a conductive layer having a first terminal and a second terminal;
an enclosure contact in electrical connection with the first terminal and the second terminal to form a closed-loop circuit;
a lens assembly, the lens assembly including the enclosure contact; and
a controller that is configured to transmit an electrical signal via the conductive layer and detect the electrical signal within the closed-loop circuit, wherein the controller is configured to transmit a terminate signal when the controller detects a change in electrical properties of the electrical signal.

10. The tamper disablement system as recited in claim 9, further comprising a switch that is configured to transition between an open state and closed state, wherein the terminate signal causes the switch to transition from the open state to the closed state.

11. The tamper disablement system as recited in claim 10, further comprising a fuse, wherein the controller is further configured to provide an electrical current to the fuse when the switch is transitioned to the closed state, wherein the fuse disables functionality of an image sensor when the fuse receives the electrical current.

12. The tamper disablement system as recited in claim 11, further comprising a printed circuit board assembly, the printed circuit board assembly including the fuse.

13. The tamper disablement system as recited in claim 12, wherein the printed circuit board assembly comprises a multilayer substrate.

14. The tamper disablement system as recited in claim 13, wherein the multilayer substrate comprises at least one dielectric layer and at least one conductive layer.

15. The tamper disablement system as recited in claim 14, wherein the at least one dielectric layer includes the fuse.

16. The tamper disablement system as recited in claim 9, further comprising an electronic control unit operably connected to the controller, wherein the electronic control unit disables functionality of an image sensor in response to receiving the terminate signal.

17. A tamper disablement system, comprising:
a conductive layer having a first terminal and a second terminal;
an enclosure contact in electrical connection with the first terminal and the second terminal to form a closed-loop circuit;
a lens assembly, the lens assembly including the enclosure contact; and
a controller that is configured to transmit an electrical signal via the conductive layer and detect the electrical signal within the closed-loop circuit, wherein the controller is configured to provide an electrical current to a fuse that disables functionality of an image sensor.

18. The tamper disablement system as recited in claim 17, further comprising a printed circuit board assembly that includes the fuse, the printed circuit board assembly comprising a multilayer substrate.

19. The tamper disablement system as recited in claim 18, wherein the fuse is disposed within at least one layer of the multilayer substrate.

* * * * *